United States Patent [19]
Hartley

[11] Patent Number: 5,825,039
[45] Date of Patent: Oct. 20, 1998

[54] DIGITALLY STEPPED DEFLECTION RASTER SYSTEM AND METHOD OF USE THEREOF

[75] Inventor: John George Hartley, Fishkill, N.Y.

[73] Assignee: International Business Machines Corporation, Armonk, N.Y.

[21] Appl. No.: 756,360

[22] Filed: Nov. 27, 1996

[51] Int. Cl.[6] .................................................. H01J 37/304
[52] U.S. Cl. ..................................... 250/492.22; 250/398
[58] Field of Search ................................ 250/492.22, 398

[56] References Cited

U.S. PATENT DOCUMENTS

| | | |
|---|---|---|
| 4,322,626 | 3/1982 | Kawashima ........................ 250/492.22 |
| 4,812,661 | 3/1989 | Owen ...................................... 250/398 |
| 5,337,247 | 8/1994 | Hamaguchi ........................ 250/492.22 |
| 5,590,048 | 12/1996 | Abe et al. ........................... 250/492.22 |

Primary Examiner—Kiet T. Nguyen

[57] ABSTRACT

A digitally stepped deflection raster system and a method of operation thereof are disclosed. The digitally stepped deflection raster system operates to provide horizontal and vertical scans of an area of interest. The total length of each of the horizontal and vertical scans is proportioned into segments to provide non-continuous scanning signals that are arranged into predetermined raster patterns each of which reduces the deflection placement error of the digitally stepped deflection raster system.

22 Claims, 11 Drawing Sheets

32

DIGITALLY STEPPED DEFLECTION RASTER SYSTEM AND METHOD OF USE THEREOF

FIELD OF THE INVENTION

The present invention relates to a digitally stepped deflection raster system. More particularly, the present invention relates to a digitally stepped deflection raster system having non-continuous vertical and horizontal scanning signals. Specifically, the present invention relates to a digitally stepped deflection raster system for scanning an area of interest by means of non-continuous vertical and horizontal scanning signals, both of which are of an approximately equal number, and both of which are used to reduce the normally occurring displacement errors of digitally stepped raster systems.

RELATED ART

An electron beam projection (E-beam) system, as well as electron microscopes, scanners for metrology tools, radar systems and even cathode ray tubes, commonly employ a raster system. The concentrated electron beam of high velocity electrons emitted from an electron gun can be deflected both horizontally and vertically in accordance with voltages applied to at least two pairs of appropriately oriented deflection plates or coils which form part of the deflection subsystem. Photon-based systems such as radar or systems using visible light may use deflection means such as antennas or movable mirrors. The error in positioning the electron beam at an exact desired position of the target, such as a semiconductor substrate being fabricated by an E-beam system, is commonly referred to as an deflection placement error. A raster subsystem that controls the movement or scanning of the electron beam cooperates with the deflection subsystem so that the electron beam is horizontally and vertically scanned to cover an area of interest. This area of interest is dependent upon various applications, but for an E-beam system used in the micro-fabrication of large scale integrated circuits it can be a semiconductor substrate. The raster subsystem used for the various applications, such as an E-beam system, have recently been revised from the use of continuous analog scanning techniques to the use of discrete digitally stepped deflection techniques and are generally referred to as discrete digitally stepped deflection raster systems. An E-beam system that uses a digitally stepped deflection raster subsystem is disclosed in U.S. Pat. No. 4,494,004 which is herein incorporated by reference.

In digitally stepped deflection raster systems, the electron beam is scanned through an area of interest, also referred to as a scanning range, divided into a row-column matrix in small incremental steps. In these digitally stepped deflection raster systems, deflection placement errors occur when a first step has not completely settled before the onset or command for movement of the electron beam by the next step. This settling error represents a drawback for the digitally stepped deflection raster system, relative to the previous raster systems that utilize analog techniques that smoothly moved the electron beam across an area of interest. The settling error per individual step is not highly significant by itself, but the settling error accumulates as long as the steps continue in the same direction across the scanning range. At the end of a scanned row when the deflection of the electron beam reverses itself by dropping down to the next column, and the scanning of the electron beam continues, the settling error again begins to accumulate, but this time with an opposite sign from the previously occurred settling errors of the above deflection scanning. The accumulative settling error in both scanning directions, such as in a first or forward direction and a second or reverse direction is commonly referred to as a "Forward-Backward" settling error which manifests its maximum displacement at the points furthest from the turnarounds, that is, at the center of the deflection field and, more particularly, at the center of the area of interest being scanned. The magnitude and exact character of this Forward-Backward error is a function of the individual step settling time (tau), step dwell time (delta t), the number, N, of steps in the row and the magnitude of the step settling error.

Deflection placement errors have several parameters associated with the digital raster subsystems which have been pursued to reduce the magnitude thereof. The parameters may be implemented into the mechanization of the step drivers of the raster subsystems that generate a digital raster signed so as to reduce the magnitude of the settling time related to the step settling error, along the lines that a sufficient time is allowed between step commands so that the step settling error related to a first command vanishes before the onset of the next step, thereby, allowing the accumulative step settling error to be eliminated. However, when extreme precision of the deflection position is required, a relatively fast speed of response is also required and it is seldom possible to allow sufficient time between steps to eliminate the accumulative step settling error. Other techniques have been considered to reduce the settling error, such as, the reduction in size of the raster and also in the lengthening of the step dwell time. The reduction in size of the raster is not desirable because its decreases the precision on the associated apparatus, while the lengthening of the step dwell time has the effect of slowing down the raster operation, which, in turn, reduces the speed of response of the associated apparatus, possibly to a non-acceptable level.

OBJECTS OF THE INVENTION

It is a primary object of the present invention to provide a digitally stepped raster deflection system, wherein the deflection placement error is reduced by a factor of nearly eight (8) as compared to prior art devices.

It is another object of the present invention to provide a digitally stepped raster deflection system that is particularly suited for usage in electron beam lithograph equipment, electron microscopes, scanners for metrology tools, raster stepper mechanical devices, radar and even in associated circuitry for cathode ray tubes.

Furthermore, it is an object of the present invention to provide a digitally stepped raster deflection system that may be implemented into existing equipment without disturbing the system operational parameters thereof.

SUMMARY OF THE INVENTION

The present invention is directed to a digitally stepped deflection raster system that provides non-continuous horizontal and vertical scanning signals so that the deflection placement error associated with the electron beam being scanned across an area of interest is reduced.

The digitally stepped deflection raster system scans an area of interest having predetermined horizontal and vertical dimensions, each serviced by corresponding horizontal and vertical scanning signals. The system comprises means responsive to the horizontal and vertical scanning signals for dividing the scanning signals covering the scanning range into a predetermined number of non-continuous or segmented signals. The system further comprises means responsive to the non-continuous segmented signals for arranging the non-continuous signals into a predetermined array that spans the area of interest and with the signals thereof scanning the area of interest in a non-continuous manner.

DETAILED DESCRIPTION OF THE INVENTION

Figure 1:
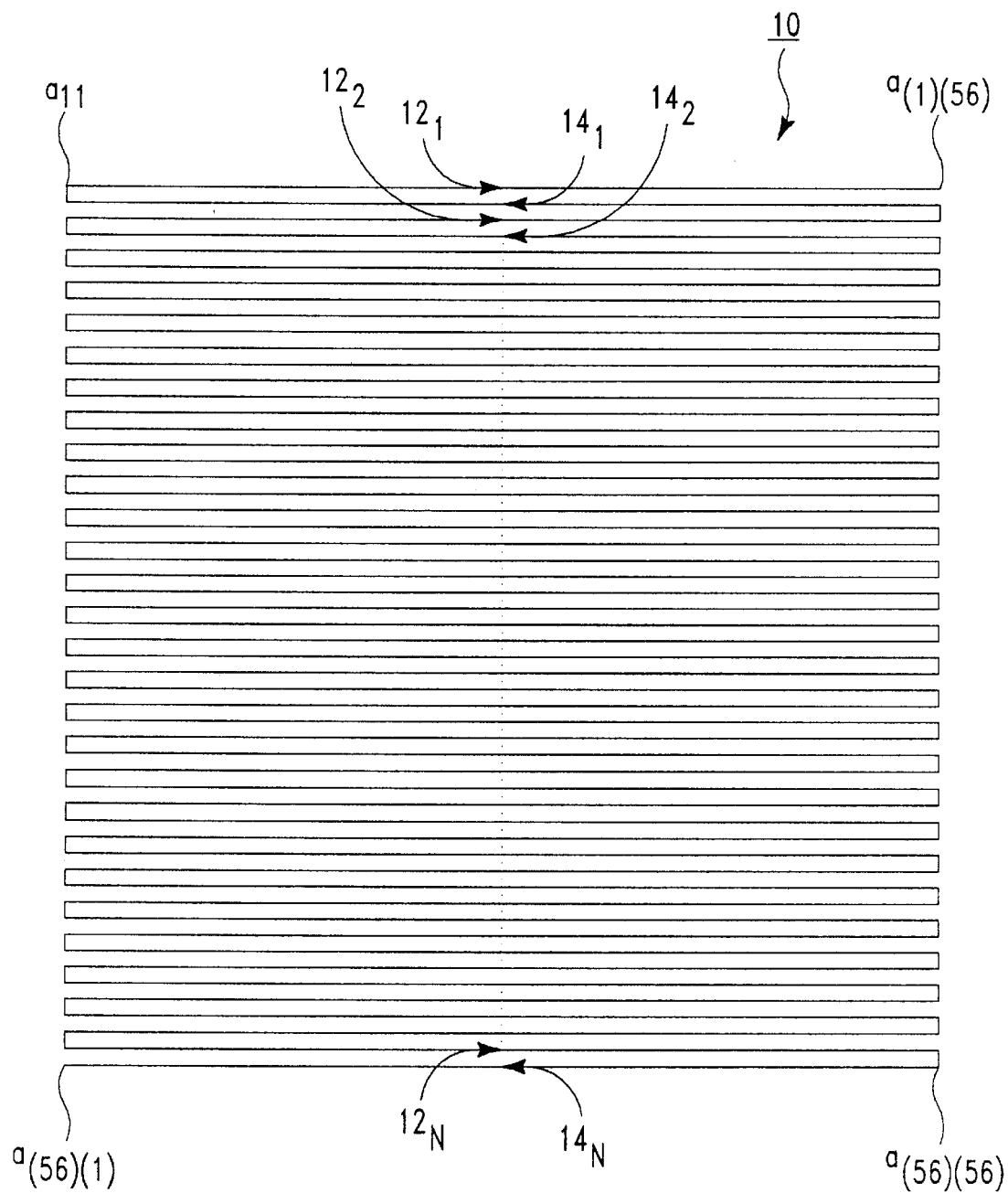
FIG. 1 is a prior art raster pattern illustrating the stepped yet continuous path of an electron beam being scanned to cover an area of interest.

Referring to the drawings, wherein the same reference numbers are used to indicate the same elements throughout, there is shown in FIG. 1 a prior art raster pattern 10, which may first be described in order to more fully appreciate the benefits and principles of the present invention.

The raster pattern 10 of FIG. 1 inherently creates the deflection positional errors of a digitally stepped raster deflection system, in a manner as described in the "Background" section. More particularly, the raster pattern 10 illustrates a stepped yet continuous path created by horizontal and vertical scanning signals stepping through an area of interest (referred to as an entire scanning range), represented in FIG. 1 as a regular lattice of fifty-six by fifty-six (56×56) points, wherein the uppermost, upper left point (as viewed in FIG. 1) for both the row (x) and column (y) coordinates is shown as $a_{1,1}$, the uppermost, upper right point is shown as $a_{1,56}$, the lowermost, lower left point is shown as $a_{56,1}$ and the lowermost, lower right point is shown as $a_{55,56}$. The raster pattern 10 is produced by a digital raster subsystem cooperating with a deflection subsystem so that an electron beam, generated by an electron gun known in the art, is scanned or moved so as to cover the area of interest represented by, for example, the fifty-six by fifty-six (56×56) matrix so that the scanning range of the beam is 56 steps in this example. The digitally stepped raster deflection system that produces the raster pattern 10 is known in the art.

The raster pattern of 10 FIG. 1 further illustrates a plurality of directional arrows $12_1, 12_2 \ldots 12_N$ showing the a first or forward direction of scanning and, similarly, FIG. 1 illustrates a plurality of directional arrows $14_1, 14_2 \ldots 14_N$ showing a second or backward direction of scanning. All the directional arrows $12_1 \ldots 14_N$ are in the horizontal dimension of the raster pattern 10. The displacement positional errors associated with the forward and backward scanning are commonly termed "Forward-Backward" displacement positional errors, previously discussed in the "Background" section. The reversal of the directions of scanning occurs at the extreme edges of each row of the raster pattern 10 and is illustrated in FIG. 1 at two locations thereof by the nomenclature (REVERSE SCAN A) and (REVERSE SCAN B).

As discussed in the "Background" section, deflection scanned electron beam placement errors occur when a step has been requested, that is, a request to move the scanned electron beam from one point (e.g., $a_{1,22}$) to another point (e.g., $a_{1,23}$) before the scanned electron beam has been given sufficient time to settle from its prior movement (e.g., from point $a_{1,21}$ to point $a_{1,22}$). As previously discussed, the settling error for an individual step is not significant by itself, but the settling error accumulates as long as the steps that move the electron beam continue in the same direction, e.g., continue in direction $12_1$. At end of the row when the deflection and scanning for moving the electron beam reverse themselves (e.g. REVERSE SCAN A) by having the movement of the electron beam drop down a column, the settling error begins to accumulate, but with an opposite sign as the electron beam is moved in the other direction, e.g., direction $14_1$. The result is that the error referred to as the "Forward-Backward" settling error has its maximum displacement at the points furthest from the turnarounds (REVERSE SCAN A-REVERSE SCAN B), that occur at the center of the deflection field, that is, the center of the raster pattern 10 which, in actuality, is at the center of the area of interest that may be that of a semiconductor substrate being micro-fabricated by an E-beam system.

The magnitude of the Forward-Backward settling error is a function of the individual settling time, the step dwell time, the number of steps in the row, and the magnitude of the individual step settling error. The present invention reduces the magnitude of the Forward-Backward settling error by a factor of nearly eight (8) in the horizontal dimension relative to the prior devices employing a raster pattern 10, and such reduction may be further described with reference to FIG. 2.

Figure 2A:
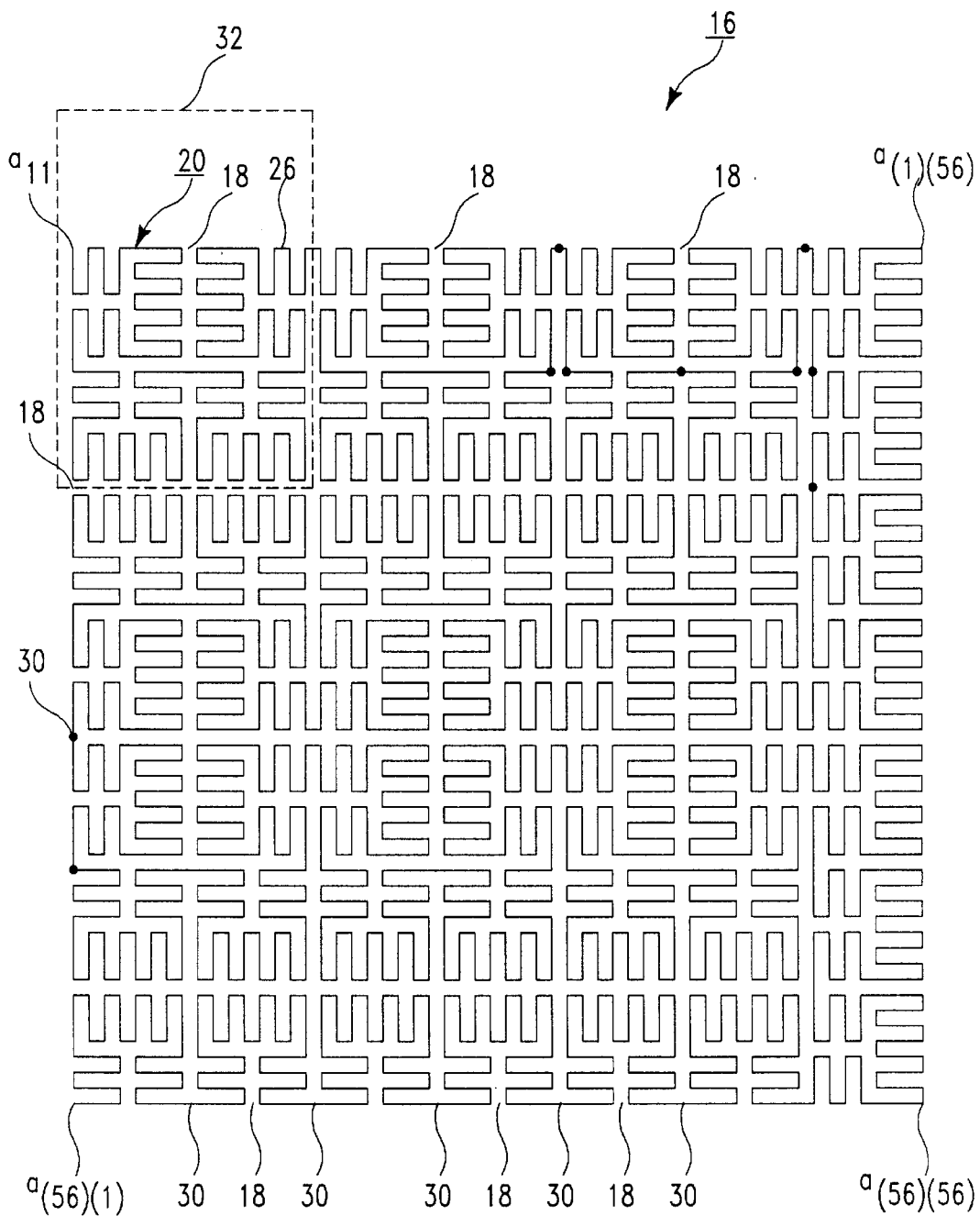
FIG. 2A is a raster pattern of the present invention illustrating the stepped and non-continuous path of the electron beam being scanning to cover the same area of interest as FIG. 1.
Figure 2B:
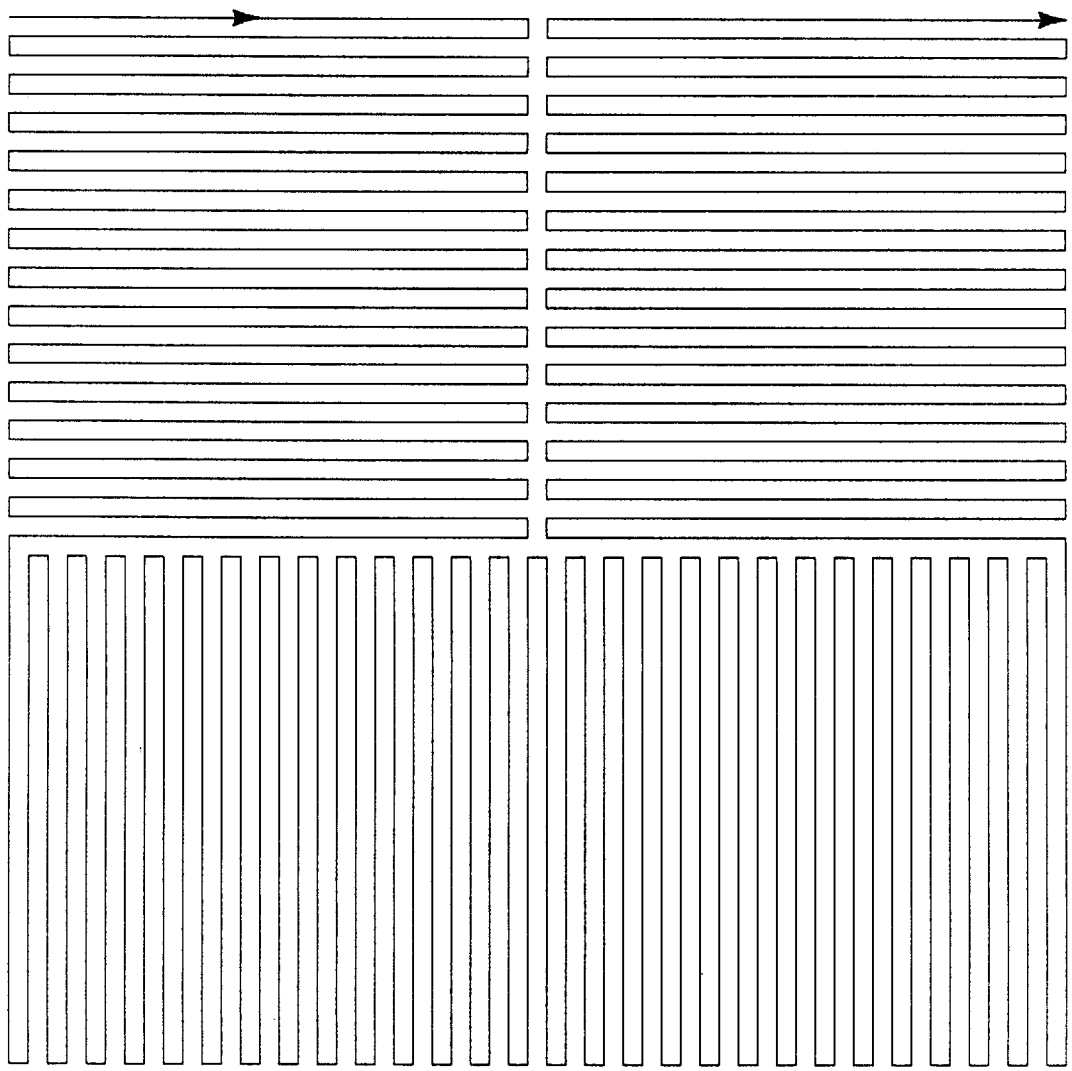
FIG. 2B is a raster pattern of the present invention illustrating a step length of N/2.

FIG. 2A illustrates one embodiment of the present invention comprising a raster pattern 16 that is created by non-continuous segmented horizontal and vertical scanning signals that yield a plurality of discontinuities in the path of the raster pattern 16, generally represented by reference number 18. For convenience in terminology, the term "non-continuous" means that the scanning range through which the beam is scanned is not continuous; i.e. a line extending across the scanning range is not continuous. The discontinuities 18 reduce the length of any continuous step that occurs in the same direction at any one time. Furthermore, and as will be more fully described, the raster pattern 16 is constructed with approximately the same number of vertical and horizontal non-continuous steps. For the raster pattern 16 shown in FIG. 2A, the longest continuous step in either the horizontal or vertical direction is seven (7), whereas the longest continuous step in the horizontal dimension of the prior art raster pattern 10 of FIG. 1 is fifty-five (55). Accordingly, the cumulative settling error of the present invention is reduced by a factor of nearly eight (8) (55/7) in the horizontal dimension. Although the invention reduces the settling error in the horizontal dimension, relative to prior art devices, the invention somewhat increases the settling error in the vertical dimension because the length of the continuous steps in the vertical direction, as seen in FIG. 2A, has been increased relative to the single vertical step of FIG. 1. The increase in vertical direction (up-down) error of FIG. 2A is estimated to be about 15–20% of the Forward-Backward error created by the raster pattern 10 of FIG. 1. It is not necessary that the number of vertical steps be equal to the number of horizontal steps though that is preferable and part of the benefit of the invention may be realized by reducing the longest horizontal step by a factor of about 2. FIG. 2B shows the area of FIG. 1 with a step length of N/2 (28 in this case).

The fractional improvement in the Forward/Backward effect due to settling for a reduction in the length of a continuous run by a factor 1 is given by EQUATION 1:

$$\frac{I(N/L)}{I(N)} = \frac{[e^{\Delta t/\tau}]^{N+1} - [e^{\Delta t/\tau}]^{N-\frac{N}{L}}}{[e^{\Delta t/\tau}]^{N+1} - 1}$$

where delta t is the step dwell time and tau is the settling time. Delta t and tau will be typically constrained by systems considerations. Throughput is improved by reducing dwell time, so the limiting case that is considered is that where the ratio delta t/tau→0, in which case, EQUATION 2:

$$\frac{I(N/l)}{I(N)} = \frac{1 + \frac{N}{l}}{1 + N} \xrightarrow[N \to \infty]{} \frac{1}{l}$$

Thus, for a reduction factor of 2, 4, or 8, the corresponding limiting case improvements reduce the forward/backward error by a factor of 0.5, 0.25 or 0.125, respectively.

A review of FIG. 2A reveals that the raster pattern 16 covers the same fifty-six by fifty-six (56×56) lattice of FIG. 1, and has a plurality of non-continuous steps in both the horizontal and vertical dimensions. In one embodiment, the raster pattern 16 is constructed from a plurality of cells 20 generally illustrated in FIG. 2A and which may be further described with reference to FIG. 3. A scan containing segments smaller than the full width of the scanning range,, such as that illustrated in FIG. 2A will be referred to as scanning the beam in a non-continuous segmented manner. As can be seen in FIG. 2A, a scanning range has at least one segment containing at least two steps and at least one other segment.

Figure 3A:
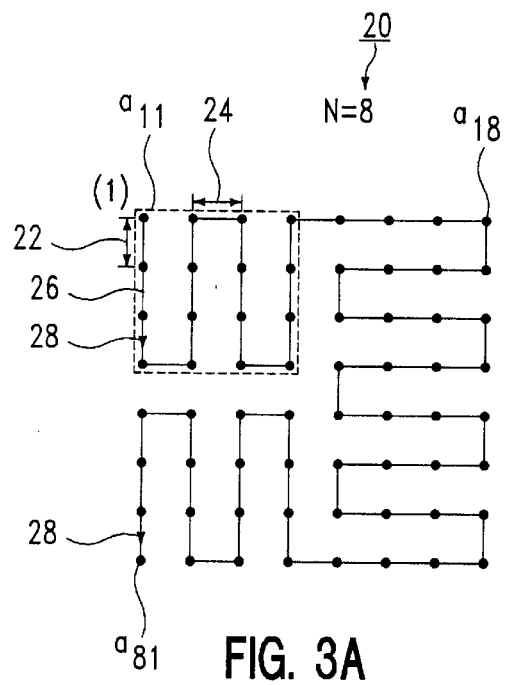
FIGS. 3A–3D illustrate one embodiment of the cells of the present invention that are be used to construct the raster pattern of FIG. 2.
Figure 3B:
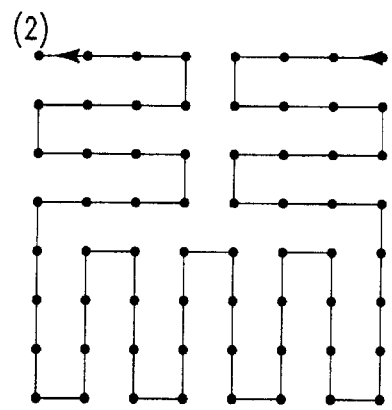
Figure 3C:
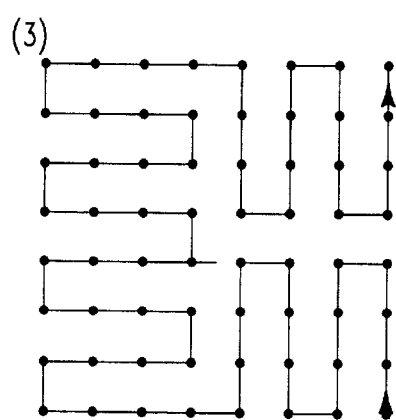
Figure 3D:
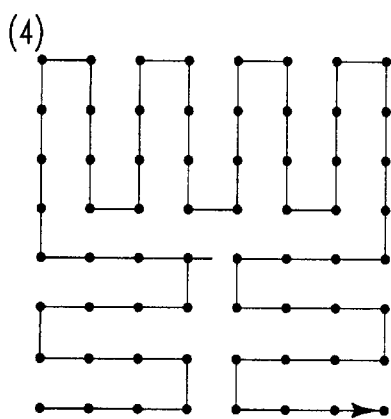

Cell 20 is arranged into an eight by eight (8×8) matrix having elements $a_{1,1}$ to $a_{8,8}$ as shown in FIG. 3A. The cell 20 comprises a plurality of vertical steps generally indicated by reference number 22 and a plurality of horizontal steps generally indicated by reference number 24. Each of elements $a_{1,1} \ldots a_{8,8}$, is indicated in FIG. 3A as a short diagonal line, representative of an area illuminated by the electron beam, controlled by the digitally stepped displacement raster system, and with the electron beam impinging an area of interest, such as a semiconductor substrate (not shown). Each of the steps 22 and 24 illustrates the movement or scanning of the electron beam from one to another location within the area of interest. The path the electron beam follows is generally indicated by reference number 26, and its direction is generally indicated by directional arrow 28. FIGS. 3B, 3C and 3D each show the cell of FIG. 3A rotated clockwise by 90°, 180° and 270° respectively. The notation used here is that the arrangement of FIGS. 3A, 3B, 3C and 3D are denoted (1), (2), (3) and (4), respectively. When the path is traversed in the opposite direction, it will be shown as (1') and the like. The set (1), (2), (3) and (4) (and corresponding sets based on other scan patterns) will be referred to for convenience as a base set of cells. Equal distribution of the F/B error is achieved when the vertical and horizontal steps are balanced. The simple raster of FIG. 1 represents the worst case.

A review of FIG. 3A reveals that cell 20 advantageously has an approximately equal number of vertical and horizontal steps 22 and 24 respectively. More particularly, cell 20 of FIG. 3A has thirty-one (31) vertical steps 22 and thirty-two (32) horizontal steps 24. It is not necessary to have the number of horizontal and vertical steps to be so close in magnitude and some of the benefits of the invention can be realized if the number of vertical steps is more than twice the number of rows.

As can be seen in FIG. 3A, cell 20 is divided into four quadrants, with the beam path being unbroken in the vertical direction for a segment of three steps in the upper left and lower left quadrants and being unbroken in the horizontal direction for a segment of three steps in the upper right and lower right quadrants. The phrase "stepping and illuminating" will be used to describe the operations of moving (stepping) to the next point in sequence and illuminating the workpiece at that point as well as illuminating the workpiece at the current point, followed by stepping to the next point. The phrase "segmented signal" will be used to refer to a scanning signal that scans over such a segment. The phrase "row-column element" will be used to refer to a segment of one or more steps, whether it is part of a row or a column. Inspection of FIG. 3A reveals that segments used therein have lengths of 1, 3 and 4 steps, covering 2, 4 and 5 array elements, respectively. Other patterns having different segment lengths may readily be devised. The phrase "set of primitive row-column elements" will be used to refer to the basic steps that are combined to form a cell, such as cell 20. In the particular case of cell 20, the set of primitive row-column elements is 1, 3 and 4.

Starting at the upper left corner of a 2N×2N array, the beam steps and illuminates N points downward in the first column, steps to the next column and steps and illuminates back up to the first row. This pattern is repeated until the first quadrant (referred to as a submodule) has been illuminated. The upper and lower right quadrants are illuminated by following the sequence of stepping and illuminating horizontally until the 8th column is reached, then stepping and illuminating horizontally in the opposite direction. Lastly, the lower left quadrant is illuminated by stepping and illuminating vertically to fill in the remaining unilluminated elements. This sequence can be applied to any even-numbered array having four or more elements on a side. FIG. 2B shows a variation of such a sequence in which the first quadrant is scanned in a first sense (horizontal), the second and third quadrants are scanned in the opposite sense (vertical) and the fourth quadrant is scanned again in the first sense.

Cell 20 has scanning path 26, that interconnects all of the elements $a_{1,1} \ldots a_{8,8}$. As seen in FIG. 3, scanning path 26 is continuous, but never exceeds seven (7) consecutive steps (22 or 24) in either the horizontal or vertical direction. The seven (7) step occurrence for the raster pattern 16 is seen in FIG. 2 and is indicated therein by the use of reference number 30. A further review of FIG. 2A reveals that this continuous seven (7) step occurrence 30 is primarily in the horizontal dimension of the raster pattern 16 but does also occur in the vertical dimension of the raster pattern 16. The raster pattern 16 of FIG. 2A is constructed with the individual cells 20 of FIG. 3 partially illustrated in FIG. 2A by groups 32 which may be further described with reference to FIG. 4.

Figure 4:
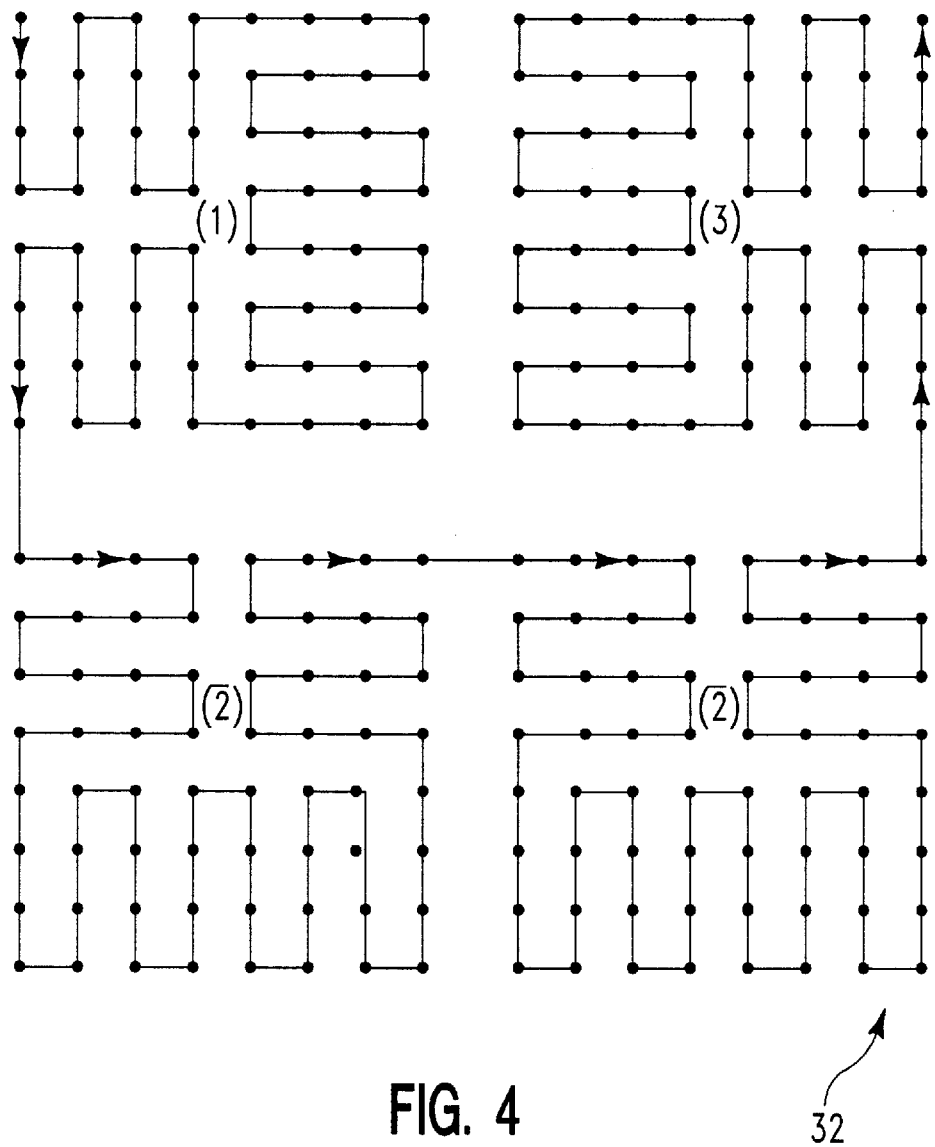
FIG. 4 is an illustration of a plurality of the cells of FIG. 3 that are used in the construction of the raster pattern of FIG. 2.

FIG. 4 shows a group of four 8×8 cells forming a 16×16 group 32 that is the basis for filling the 56×56 element array 16. It comprises a first group (1) connected to a group (2') directly below that is, in turn, connected to a second group (2') in the lower right corner of group 32 that is, in turn, connected to a group (3) in the upper right corner. This group 32 is repeated three times along the top 16 rows of array 16, filling the first 48 columns of those 16 rows. The last 8 columns are filled by two arrays (1) connected vertically at $a_{8,48}$. At position $a_{16,48}$ another vertical connection is made to another pair of group (1) arrays connected vertically. The remainder of rows 17–32 is traversed from right to left with three groups 32' comprising a group (3) in the lower right, groups (4') in the upper right and upper left and group (1) in the lower left. Rows 33–48 repeat the pattern of rows 1–16 and rows 49–56 comprise an array (1) at the right edge, followed by six group (4') arrays traversed from right to left.

The arrangement of group 32, as well as the raster pattern 16, is only one embodiment of the present invention and is primarily illustrated herein to describe the principles of the present invention. A further embodiment of the cells of the present invention that may be used to construct a raster pattern similar to pattern 16 of FIG. 2A may be further described with reference to FIG. 5A.

Figure 5A:
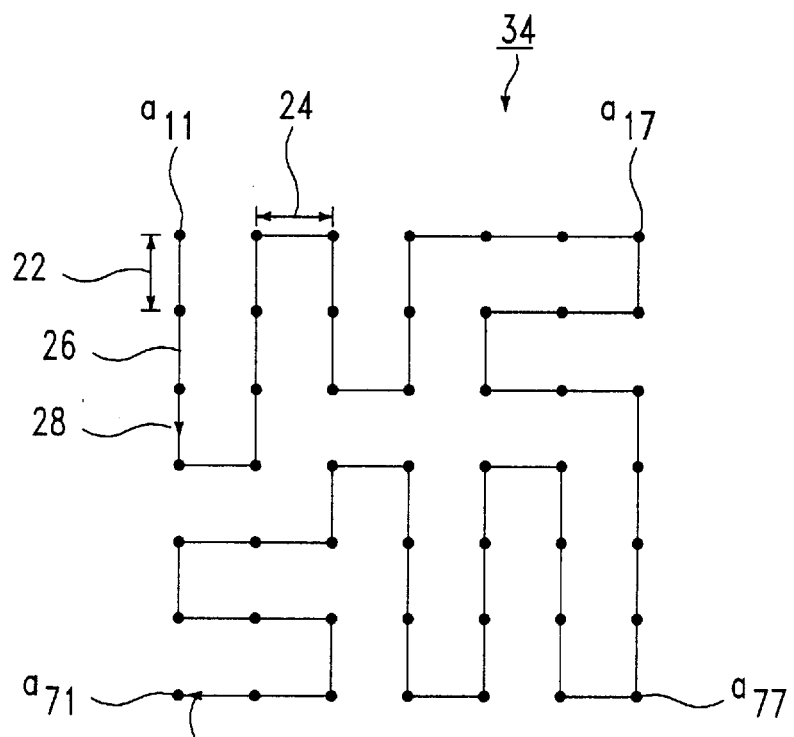
FIG. 5 is an illustration of the cells of another embodiment of the present invention used to construct the raster pattern of FIG. 2.

FIG. 5A illustrates a cell 34 arranged in a similar manner as cell 20 of FIG. 3 but comprising a seven by seven (7×7) array having elements $a_{1,1} \ldots a_{7,7}$. The cell 34 has vertical steps 22 and horizontal steps 24 similar to those of cell 20, as well as the scan path 26 whose direction is indicated by directional arrow 28. Cell 34 of FIG. 5A has twenty-seven (27) vertical steps 22 and twenty (20) horizontal steps 24 which provides an adequate balance therebetween but which is somewhat less than the balance of the vertical (22) and horizontal (24) steps achieved by cell 20 of FIG. 3. The cell 34 of FIG. 5A may be used to construct the raster pattern 16 in a manner similar to that as described for cell 20 of FIG. 3 by use of rotated patterns traversed in one or another direction.

Figure 5B:
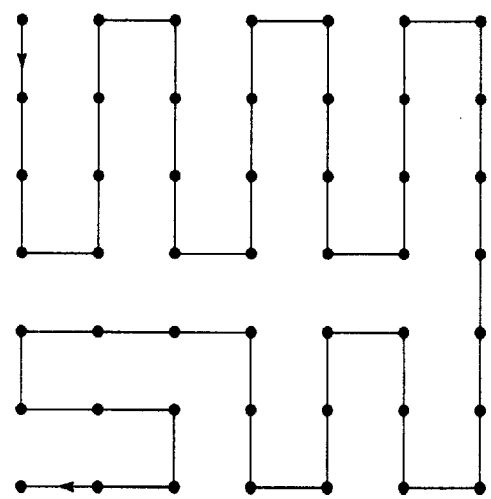
Figure 7A:
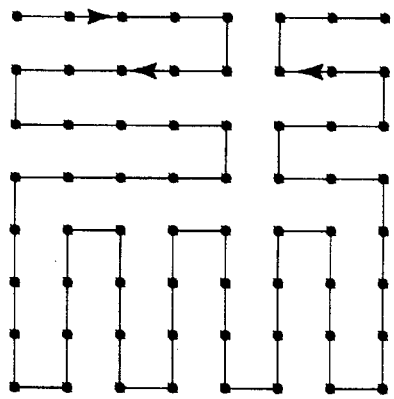
FIGS. 7A and 7B illustrate alternative embodiments of the pattern of FIG. 3.
Figure 7B:
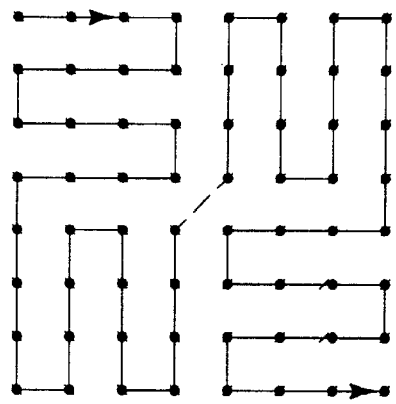
Figure 8:
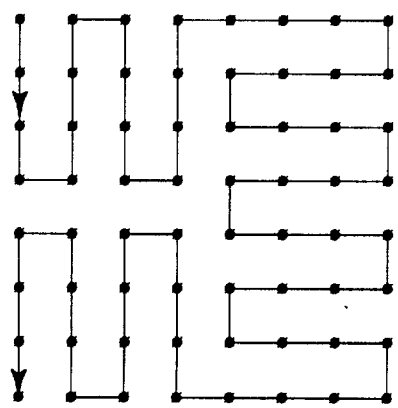
FIG. 8 illustrates another embodiment of the invention.

Those skilled in the art will readily appreciate that a number of alternative patterns such as that shown in FIG. 5B for arrays with odd numbers may be used. For arrays with even numbers, the examples in FIGS. 7A and 7B may be used. The array in FIG. 7A is less balanced than the preferred array of FIG. 3A and the array of FIG. 7B has the drawback that the step indicated by the dotted line at the center is wasteful since in going from element $a_{5,4}$ to element $a_{4,5}$, the beam will have to step over element $a_{4,4}$ without illuminating it. FIG. 8 shows a pattern suitable for an array having odd and even numbers of elements.

Odd-numbered arrays such as that illustrated in FIGS. 5A and 5B can not, of course, have submodules of the same size. even-numbered arrays such as that illustrated in FIG. 7A need not have submodules of the same size, though equal sizes are preferable.

In operation, the raster pattern 16 may be constructed with either cells 20 or 34, or a combination thereof. It is important that the construction of raster pattern 16 with cells 20 and 34 establish an approximately equal number of horizontal (24) and vertical (22) steps. The approximately equal number of horizontal and vertical steps achieves a balance so that the electron beam is scanned or moved in both the horizontal and vertical dimensions so as to cover an area of interest and substantially any location therein. The balance between the horizontal and vertical steps provides a corresponding balance between the deflection positional errors in the horizontal and vertical dimensions so that the overall deflection positional error is balanced therebetween. The spacing between the elements $a_{1,1} \ldots a_{8,8}$ of the cells 20 or 34 determines the distance between the locations in the area of interest that the electron beam may impinge. This distance determines the granularity or resolution of the overall system employing the digitally stepped deflection raster system. Typically, the e-beam spot will have an area such that there is continuous coverage of the entire area scanned. Deflections may be cascaded. For example, a primary deflection may step the beam from center to center of small regions called subfields and a secondary or vernier deflection system may step the beam within such a subfield. If the secondary system employs a raster scheme, then it, too, may benefit from the invention.

The raster pattern 16 generated by an appropriate system, allows an area of interest on a workpiece, such as a semiconductor substrate, to be scanned in both the horizontal and vertical directions, by an electron beam, such as that generated by an electron beam (E-beam) projection system used in the micro-fabrication of a large scale integrated circuits.

Figure 9:
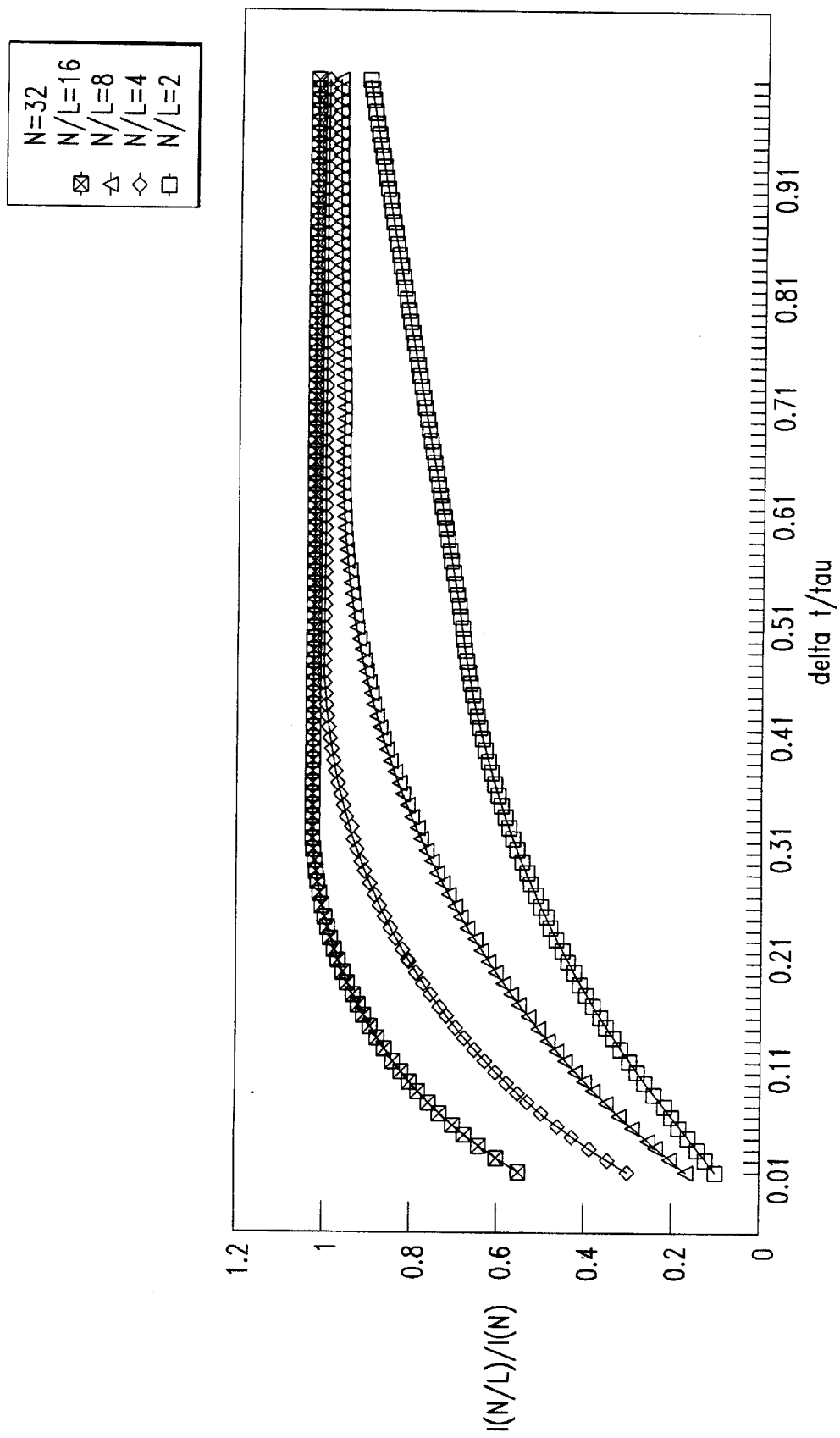
FIGS. 9–11 show the improvement resulting from various reduction factors.
Figure 10:
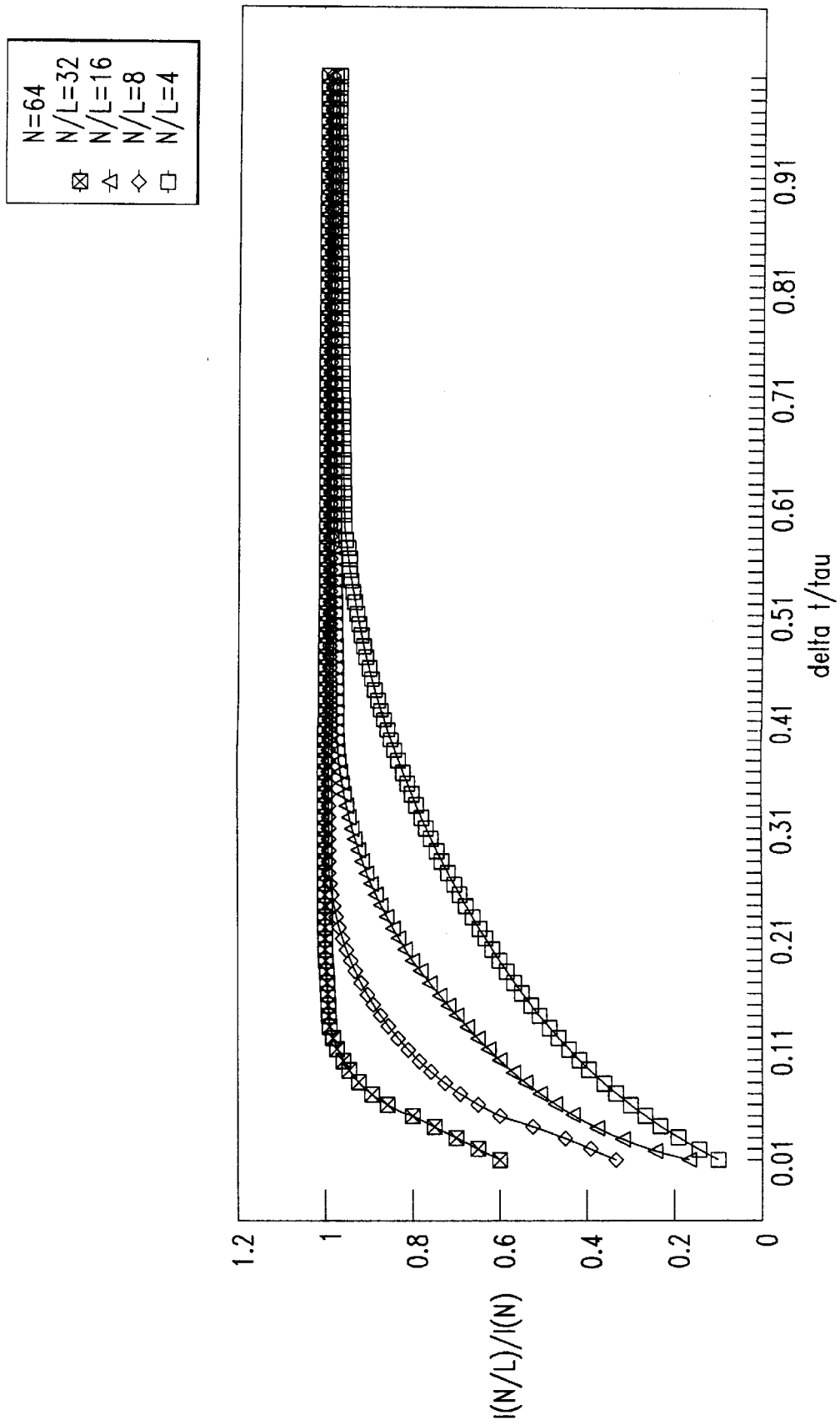
Figure 11:
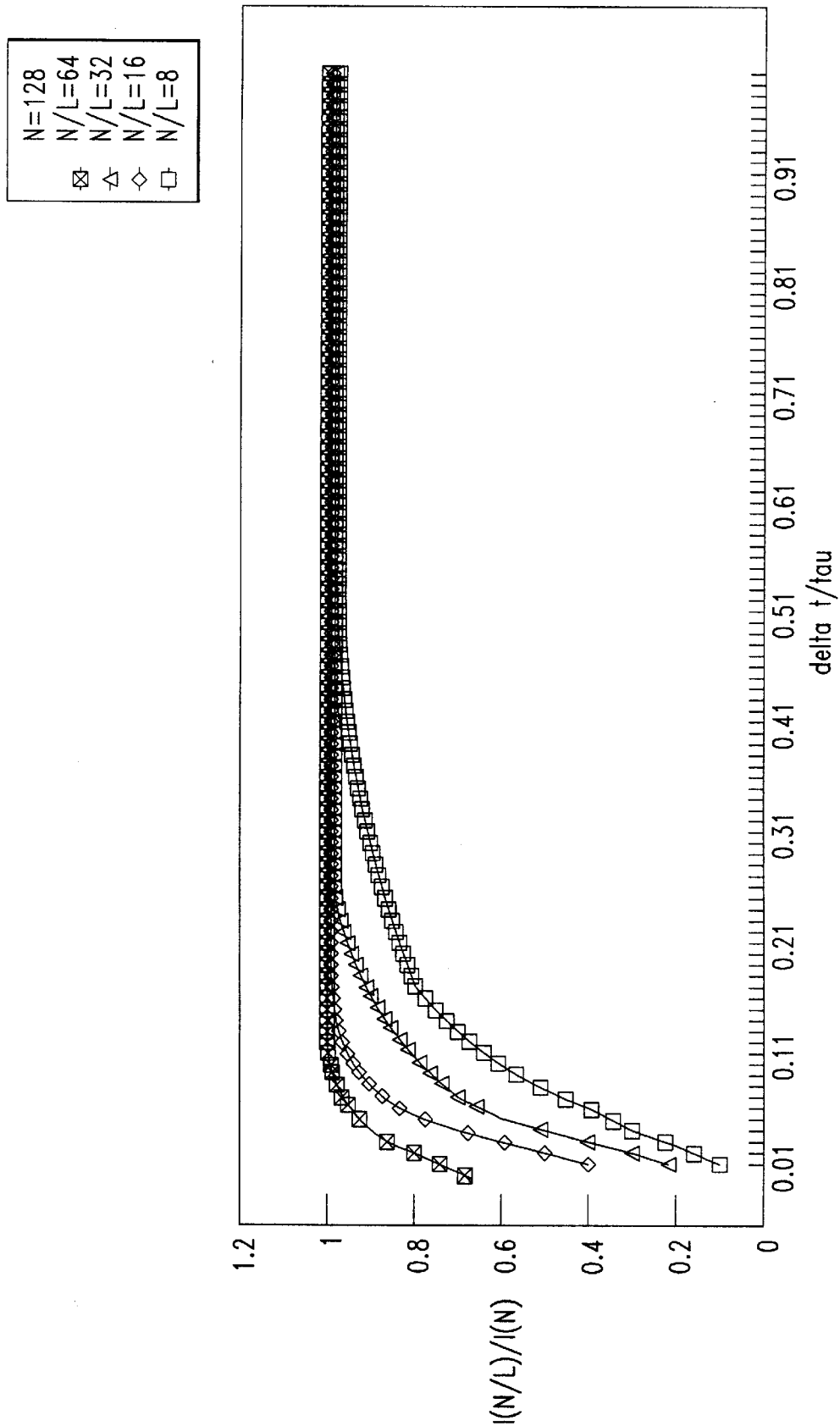

The electron beam is scanned in both the horizontal and vertical dimensions, in a stepped manner. As seen in FIG. 2A for raster pattern 16 and generally indicated by reference number 30, the length of the scan in any one direction, at any one time, is seven (7) steps which is unlike the length of the scan related to the raster pattern 10 of FIG. 1 having a maximum length of fifty-five (55) steps in one direction, that is, in the horizontal direction. The present invention by reducing this length to seven (7) steps correspondingly reduces the deflection positional error in the horizontal dimension by up to a factor of eight (8), that is, by 55/7. In the limit where delta $t/tau \to 0$ and large N the positional error in the horizontal dimension is reduced by a factor of N/7 so a large raster could see a greater improvement. It should be noted that the practice of the present invention is not limited to this reduction factor of nearly eight (8) because raster patterns other than raster pattern 16 may be constructed so that the maximum number of steps in a continuous manner in any one direction at any one time is less than seven (7). Referring now to FIG. 9, there is shown the improvement afforded by use of the invention for a range of delta t/tau, N, and scale factor 1. In general, a larger scale factor affords greater improvement in settling error and increases the range of the ratio over which there is improvement. FIGS. 10 and 11 show corresponding graphs for N=64 and 128.

It should now be appreciated that the practice of the present invention provides for a raster mechanization that minimizes the cumulative deflection positional error. The raster pattern of the present invention is easily adaptable to its usage in electron beam lithograph equipment, electron microscopes, scanning metrology tools, raster stepped mechanical devices, radar, and even in scanning circuitry for cathode ray tubes. Each of these devices has a digitally stepped deflection raster system that is known in the art and need not be described herein. The adapting of the practice of the present invention to existing digitally stepped deflection raster systems may be further described with reference to FIG. 6.

Figure 6:
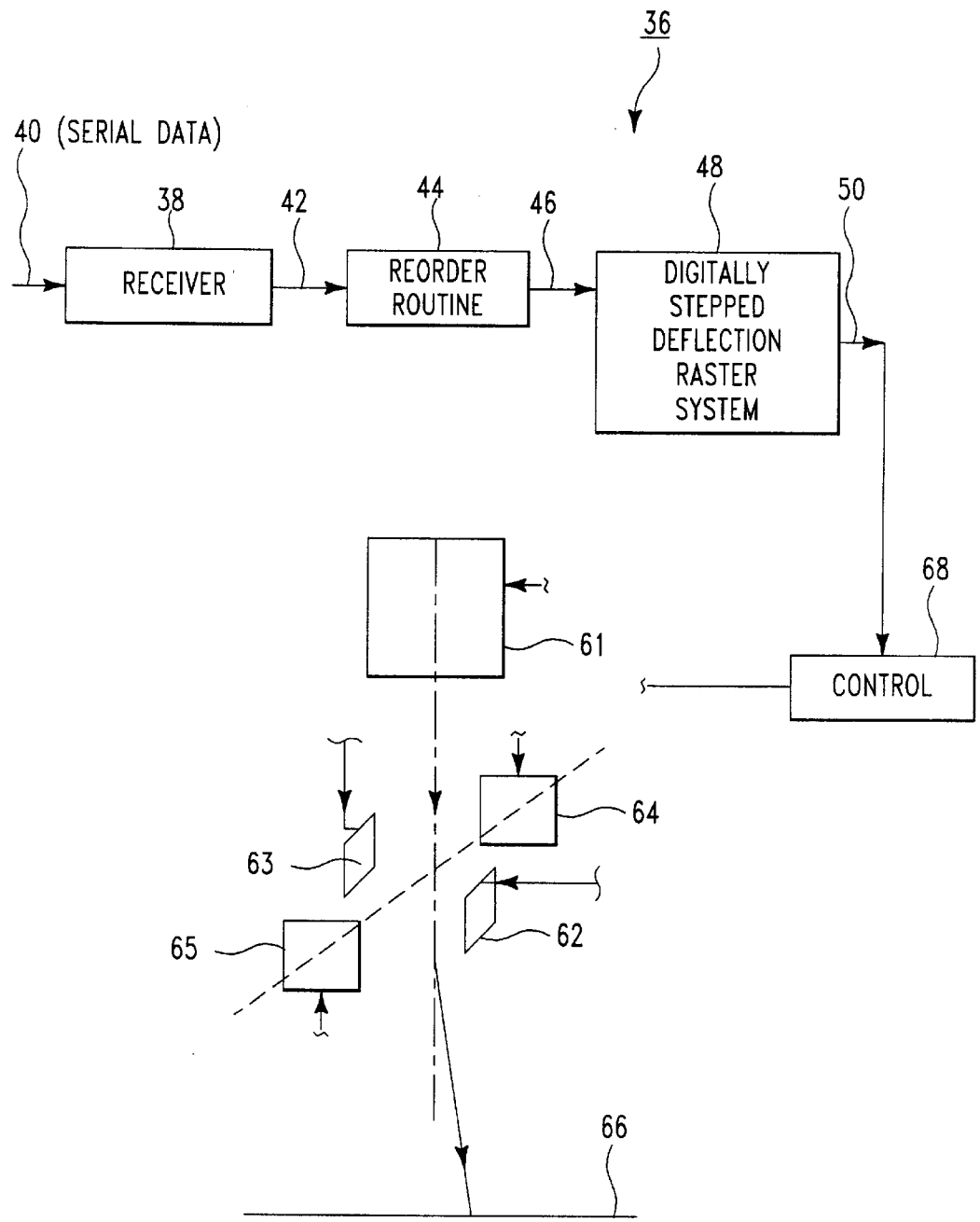
FIG. 6 is a block diagram illustrating the interface of serial data representative of target information that is synchronized with the scanning signals so that the target information intercepts the desired location of the area of interest, such as a semiconductor substrate.

FIG. 6 illustrates an arrangement 36 comprising a receiver 38 that receives external serial data 40 (e. g. gray scale data) and generates output signals 42 that are routed to a reorder routine 44 which, in turn, directs output signals 46 to a digitally stepped deflection raster system 48 which, in turn, provides the stepped horizontal and vertical scanning signals 50 so that an area of interest covered by the raster pattern 16 of FIG. 2A is properly scanned. In actuality, the raster pattern 16 defines the magnitude of the area of interest and may be referred to herein as an area of interest 16. System 48 may optionally operate in real time or contain storage means for holding a set of signals in storage. The system of FIG. 6 is constructed to process external data that are formatted to have a conventional sequence such as that illustrated in FIG. 1. If the external data were presented in the sequence of FIG. 2A, then the reorder routine would not be needed and system 48 would execute the sequence of FIG. 2A by fetching segmented signals from storage means and supplying the data and segmented signals to the system controller.

Signals 50 are applied to control means 68 that generates appropriate signals to control the various components of the scanning system. Beam source means 61 optionally generates the beam to be scanned across area 16 under control of controller 68, turning the beam on and off as directed. X-deflection means 62 and 63 and Y-deflection means 64 and 65, shown in perspective on the X and Y axes, deflect the beam under control of controller 68 to strike workpiece 66 in the appropriate sequence. The deflector means may be electrostatic plates for changed particles, movable mirrors for visible light, or antenna steering motors for radar, and the like.

Without the benefits of the present invention, the serial data 40 are formatted to be positional synchronized with the scanning signals 50 of the digitally stepped deflection raster system so that the serial data 40, representative of target information, intercept the target, that is, a predetermined location of an area of interest 16, under control of the scanning signals 50. However, unless the serial data 40 are reordered and unless the digitally stepped deflection raster system 48 produces non-continuous, segmented horizontal and vertical scan signals rather than the prior art continuous horizontal and vertical scan signals, the digitally stepped deflection raster system will suffer from the relatively large settling error described with reference to FIG. 1. The present invention modifies the received serial data 40 so that the serial data 40 are synchronized with the non-continuous horizontal and vertical step synchronization signals generally indicated in FIG. 6 by reference number 50. This modification is primarily achieved by a reorder routine 44. The correlations of the serial data 40 to prior art raster pattern 10 and to the raster pattern 16 of the present invention are respectively shown in Tables 1 and 2 (following), wherein the symbol, i, represents the sequence number of the information in the serial data 40, a [i] represents the address element of raster pattern 10, j represents a reorder number which selects the address element a [j] of raster pattern 16.

TABLE 1

| Sequence Number i | Address Element a[i] |
|---|---|
| 1 | 1,1 |
| 2 | 1,2 |
| 3 | 1,3 |
| . | . |
| . | . |
| 3134 | 54,3 |
| 3135 | 56,2 |
| 3136 | 56,1 |

TABLE 2

| Sequence Number i | Reorder Number j | Address Element a[j] |
|---|---|---|
| 1 | 1 | 1,1 |
| 2 | 112 | 2,1 |
| 3 | 113 | 3,1 |
| . | . | . |
| . | . | . |
| 3134 | 3134 | 56,3 |
| 3135 | 3135 | 56,2 |
| 3136 | 3136 | 56,1 |

From Tables 1 and 2, it is should be noted that the last element address element of each of the Tables 1 and 2 corresponds to the location 56,1, which is in conformity with the respective raster patterns 10 and 16. The correlation of serial data 40 represented by Table 2 is embodied in the reorder routine 44. Illustratively, reorder routine 44 and other system blocks of FIG. 6 may be embodied in a general purpose digital computer programmed in a conventional manner, well known to those skilled in the art. The reorder routine 44 may be accomplished, in a manner known in the art, by means of an array of pointers so that the information in the serial data 40 originally formatted to be continuously scanned by raster pattern 10 generally illustrated in FIG. 1, is rearranged into cells 20 and 32 so that the raster pattern 16 of FIG. 2A is constructed and is used to direct the serial data onto the target. In general, the array of pointers in the reorder routine recognize the original temporal and/or spatial format of the serial data 40 and reorder this format so that the serial data 40 correspond to temporal and spatial format of the raster pattern 16. If the serial data are to be later used in a simple raster device possessing the raster pattern 10 not having the benefits of the present invention, the serial data can be reordered by routine 44 and then stored in its original format, such that shown in Table 1, in memory locations for later usage in the simple raster. Although it is preferred that a microprocessor embodying the array of pointers of the reorder routine 44 be used, other hardware devices or software routines may be used so long as the information contained in the serial data 40 is steered and directed to the proper location in the area of interest and, more particularly, to the proper element $a_{1,1} \ldots a_{8,8}$ making up the cells 20 or 34 that are used preferably to construct the raster pattern 16.

It should now be appreciated that the practice of the present invention provides for a reorder routine which allows the reception of serial data to be reformatted into a raster pattern 16 shown in FIG. 2A so as to operate the associated equipment with reduced deflection positional errors.

Depending on the system application, reorder routine 44 may be called on to operate in real time on data received in real time from some external source; or it may be called on to operate only once on fixed data. In the latter case, the reordered data may conveniently be stored in storage means (disk drive, random access memory, etc.) located in any of the systems blocks (e.g. block 48).

Those skilled in the art will readily be able to devise other embodiments of the invention in the light of the foregoing disclosure and the embodiments disclosed are not to be construed as limiting the scope of the following claims. By way of example and not as a limitation, the invention may be employed with respect to photon-based systems using electromagnetic radiation in the visible or microwave region as well as with electron or other charged-particle based systems.

What I claim is:

1. A digitally stepped deflection raster system for scanning a beam over an area of interest on a workpiece having predetermined horizontal and vertical dimensions in response to external data and to corresponding horizontal and vertical scanning signals corresponding to said external data, said system comprising:

(a) a system controller;

(b) beam generation means connected to said system controller;

(c) beam deflection means connected to said system controller;

(d) signal processing means responsive to said external data and to said corresponding horizontal and vertical scanning signals for reordering said external data to form a set of reordered data and for generating a set of non-continuous segmented signals; and (e) means responsive to said segmented signals for arranging said non-continuous segmented signals into a set of segmented signals that span said area of interest and for passing said set of segmented signals to said system controller, whereby said beam scans said area of interest in a non-continuous segmented manner, in which said beam is scanned over a scanning range in at least two discontinuous segments.

2. A system according to claim 1, in which said area of interest comprises a set of beam illumination locations arranged in M rows and N columns and said set of non-continuous segmented signals includes more than 2M vertical segmented signals.

3. The system according to claim 2, wherein said set of said non-continuous signals comprises a substantially equal number of said non-continuous segmented signals representative of said horizontal and vertical scanning signals.

4. The system according to claim 3, wherein said area of interest is divided into a matrix that is grouped into cells having a predetermined and approximately equal number of row-column elements that are all scanned by said respective non-continuous segmented signals.

5. A system according to claim 1, in which said area of interest comprises a set of beam illumination locations arranged in M rows and N columns and said set of non-continuous segmented signals includes a longest horizontal signal that has an integral number of steps that is greater than 1 and less than N/2 steps.

6. The system according to claim 5, wherein said longest horizontal signal has an integral number of steps that is greater than 1 and less than N/7 steps.

7. The system according to claim 6, wherein said respective non-continuous segmented signals scanning said scanning range each has a predetermined length that does not exceed a length that includes eight of said row-column elements.

8. A method of operating a digitally stepped deflection raster system for scanning an area of interest having predetermined horizontal and vertical dimensions of M rows and N columns by corresponding horizontal and vertical deflection signals, said method comprising the steps of:

(a) arranging a set of segmented signals into a scan sequence of said segmented signals that span said area of interest; and (c) scanning said area of interest with said deflection signals in said scan sequence in a segmented manner, in which said beam is scanned over a scanning range in at least two discontinuous segments.

9. The method according to claim 8, in which said area of interest comprises a set of beam illumination locations arranged in M rows and N columns and a set of non-continuous segmented signals includes more than 2M vertical segmented signals.

10. The method according to claim 9, in which said set of said non-continuous signals comprises a substantially equal number of said non-continuous segmented signals representative of said horizontal and vertical scanning signals.

11. The method according to claim 10, in which said area of interest is divided into a matrix that is grouped into cells having a predetermined and approximately equal number of row-column elements that are all scanned by said respective non-continuous segmented signals.

12. The method according to claim 8, in which said area of interest comprises a set of beam illumination locations arranged in M rows and N columns and a said set of non-continuous segmented signals includes a longest horizontal signal that has less than N/2 steps.

13. The method according to claim 12, in which said longest horizontal signal has less than N/7 steps.

14. The method according to claim 13, in which said respective non-continuous segmented signals scanning said scanning ranges each has a predetermined length that does not exceed a length that includes eight of said row-column elements.

15. A method of operating a digitally stepped deflection raster system for scanning an area of interest having M rows and N columns, said method comprising the steps of:

(a) arranging a set of non-continuous segmented deflection signals into a predetermined array of said non-continuous segmented deflection signals corresponding to a scan set of row-column elements, each of which row-column elements has less than M steps, that span said area of interest; and (b) scanning said area of interest with said non-continuous segmented signals in a segmented manner, in which said beam is scanned over a scanning range in at least two discontinuous segments.

16. A method according to claim 15, further comprising a step of dividing said area of interest into a matrix that is grouped into cells having elements located in more than one row and more than one column and each of which cells is a member of a base set of cells.

17. A method according to claim 16, in which said base set of cells comprises a first cell and three other cells that are formed by successive 90° rotations of said base cell.

18. A method according to claim 17, in which said first cell of said base set of cells is formed from a set of primitive row-column elements.

19. A method according to claim 17, in which said first cell of said base set of cells is divided into four submodules, each of which comprises at least two adjacent row-column elements.

20. A method according to claim 19, in which two of said four submodules comprise at least two adjacent horizontal row-column elements and two of said four submodules comprise at least two adjacent vertical row-column elements.

21. A method according to claim 19, in which said first cell of said base set of cells comprises substantially equal numbers of vertical and horizontal row-column elements.

22. A method according to claim 17, in which said first cell of said base set of cells comprises substantially equal numbers of vertical and horizontal row-column elements.

* * * * *